(12) United States Patent
Brey et al.

(10) Patent No.: US 7,272,517 B1
(45) Date of Patent: Sep. 18, 2007

(54) METHOD AND SYSTEM FOR PROVIDING PERFORMANCE ESTIMATIONS FOR A SPECIFIED POWER BUDGET

(75) Inventors: Thomas M. Brey, Cary, NC (US); Wesley M. Felter, Austin, TX (US); Charles R. Lefurgy, Round Rock, TX (US); Karthick Rajamani, Austin, TX (US); Juan C. Rubio, Austin, TX (US); Malcolm S. Ware, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/380,101

(22) Filed: Apr. 25, 2006

(51) Int. Cl.
*G01R 21/00* (2006.01)
*G06F 15/00* (2006.01)

(52) U.S. Cl. ........................ 702/60; 702/180
(58) Field of Classification Search ............ 702/60
See application file for complete search history.

(56) References Cited

U.S. PATENT DOCUMENTS

| | | | | |
|---|---|---|---|---|
| 4,670,713 A | * | 6/1987 | Scheib | 324/103 R |
| 6,366,889 B1 | * | 4/2002 | Zaloom | 705/7 |

2006/0156042 A1   7/2006  Desai et al.

OTHER PUBLICATIONS

U.S. Appl. No. 11/032,877, Desai, et al.
U.S. Appl. No. 11/289,249, Brey, et al.

* cited by examiner

*Primary Examiner*—John Barlow
*Assistant Examiner*—Lisa Sievers
(74) *Attorney, Agent, or Firm*—Mitch Harris, Atty at Law, LLC; Andrew M. Harris; Casimer K. Salys

(57) ABSTRACT

A method and system for providing performance estimations for a specified power budget provides an indication of the impact on processing performance when closed-loop power/performance control is employed to meet the specified power budget. A workload, which may be the actual workload, or a test workload is run to determine actual power consumption at intervals during the execution of the workload. The power values are examined and if they exceed the specified budget, which may be one of multiple possible budget values, an estimate of the amount by and duration for which the closed-loop power/performance control would have to reduce the performance of the system for each interval in order to provide an estimate of actual performance for the budgetary level(s). The estimate is informed by tests of the workload at each power/performance level to provide a non-linear estimate of the relationship between performance and power for the particular workload.

20 Claims, 5 Drawing Sheets

METHOD AND SYSTEM FOR PROVIDING PERFORMANCE ESTIMATIONS FOR A SPECIFIED POWER BUDGET

CROSS-REFERENCE TO RELATED APPLICATIONS

The present application is related to previously-filed co-pending U.S. patent application Ser. No. 11/289,249 filed on Nov. 29, 2005 and entitled "HISTOGRAM DIFFERENCE METHOD AND SYSTEM FOR POWER/PERFORMANCE MEASUREMENT AND MANAGEMENT." The above-referenced Patent Application has at least one inventor in common with the present application and is assigned to the same assignee. The specification of the above-referenced Patent Application is incorporated herein by reference.

BACKGROUND OF THE INVENTION

1. Technical Field

The present invention relates generally to power/performance measurement and management in processing systems, and more particularly, to an estimation scheme that can predict a measure of computing performance from a specified power budget.

2. Description of the Related Art

Vendors of multiple processor servers and other medium to large-scale data processing systems are finding it increasingly necessary to incorporate sophisticated power measurement and management subsystems within such computer systems. In particular, budgetary power management is employed in groups of server systems located in racks or facilities with fixed power limits or where control of overall power consumption is desirable for thermal or economic reasons. Further, under power supply fault conditions, it is possible to continue operating at a lower power level when multiple power supplies are available and one of them has failed.

Even uniprocessor workstation systems, such as notebook computers that employ selectable or automatically selected power conservation modes, may benefit from power monitoring and control software that controls the power consumption of the system. In particular, specifying an upper bound on power consumption in a battery operated system determines an absolute minimum battery life.

In the multi-processor server systems described above, control of the power can be achieved by sophisticated power management solutions that include techniques such as dynamically adjusting the frequencies of the processors within the system to ensure that a power budget is maintained. Simultaneously, system designers and operators are be provided with the ability to set different power budgets (at design-time and run-time) to meet their environmental and cost constraints using emerging power management solutions. However, automatic control of the system performance by the dynamic power management solutions mentioned above makes it difficult to predict how power management will affect performance for a given workload, as the power control system will dynamically change the performance of the system in order to maintain a specified power budget.

Systems operators and architects need to know how particular power budgets will affect the processing performance of a system and in particular how the actual workload actually executing on the system will be affected by a power budget. The actual impact of an imposed power budget depends on complex relationship between the workload, the specific power budget, the control algorithm used to enforce the budget, and characteristics of the particular processing system. For example, a power budget may hardly affect system power/performance at one level, but another nearly identical power/performance level may have a more severe impact on the system. Since the behavior is non-linear in general and related to the specific workload(s), a lack of knowledge of the relationship between power budgets and performance can cause the system operator or architect to set a power budget that is undesirable.

Rough power/performance estimations can be accomplished by running a workload at each power-performance state while taking power measurements and performance measurements. The state with the highest performance that meets the power budget is used as an estimation of the performance of similar workloads under the same power budget. However, such analyses do not give accurate estimations of performance for system that take advantage of automatic, adaptive control mechanisms that meet power budgets by employing dynamically-changing multiple power states that provide a more energy-efficient and/or higher-performance solution.

Linear regression and other modeling techniques have been used to relate system performance to operating power levels, or vice-versa, so that performance can be roughly estimated for a performance level that will meet a power budget under all conditions. However, such estimating techniques will underestimate the actual performance for a given power budget of a system having closed-loop power that adjusts the performance level of the system dynamically.

It is therefore desirable to provide a method and system for estimating processing performance from a specified power budget in a processing system having closed-loop power/performance control. It is further desirable to provide such a method and system that provide a realistic estimate with respect to the actual workload being executed by the processing system.

SUMMARY OF THE INVENTION

The objective of providing a performance estimate for a specified power budget that realistically simulates an actual workload is provided in a method, a computer performing the steps of the method and in a computer program product encoding program instructions for carrying out the steps of the method.

The method and system either load values from a previous run of a test workload, execute a test workload that may be selected by category by a user, or execute an actual workload within the processing system for which performance is to be estimated.

The power usage at maximum performance (i.e., no closed-loop power control) is observed over a sequence of intervals. The specified power budget (or a number of power levels used to tabulate the effects on performance of multiple potential budgetary levels) is used to determine which intervals have power consumption values that exceed the power budget. Then the relative amount of time of the over-budget intervals with respect to the total execution time is combined with the amounts by which those intervals exceeded the power level in order to estimate how much overall performance reduction must be introduced in order to meet the specified budget level (or tabulated potential budgetary levels). The resulting performance value(s) can be expressed relative to a processor frequency or some other figure of merit, such as a percentage of a maximum performance figure.

The power measurements at each interval may be collected in a histogram, incrementing a bin corresponding to the data value or range in which the power value falls at the end of each interval. The histogram counts can then be totaled and the counts for bins exceeding the budgetary level along with the amount by which the bin exceeds the budgetary level used to determine the effect on performance.

Alternatively, the power level may be observed as a continuous timeline and for each interval in which the power budget exceeded the budgetary limit, a factor by which that interval exceeded the power budget used to estimate the effect on the length of the interval (i.e., how long would that portion of the workload taken to complete at a performance level that meets the power budget).

The factor by which the performance level must be reduced in both of the above techniques is based on a generated function of power level versus performance determined by running either the actual workload, selected test workload or previously run test workload at each of the selectable performance levels. By using the actual performance levels used by the closed-loop power control, an accurate estimate of what the closed-loop power control should actually do to meet the power budget is imposed in the estimation. Additionally, using power measurement intervals of the same time duration as the power measurement intervals of the closed-loop power control improves the accuracy of the performance estimate, by matching the estimation to the actual control algorithm update rate.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

The present invention concerns a technique for performance estimation in a processing system that employs power/performance control to meet budgetary requirements. For a set of tabulated power budgets, or a user-specified power budget, the method estimates the performance of the processing system for a given workload. The workload may be a predetermined reference workload, a user-selected workload from set of reference workloads, or an actual workload set up by a user, generally a system administrator or integrator.

The techniques of the present invention provide a performance figure of merit for a given workload under controlled execution at a given power budget without requiring that the workload be actually run at the power budget at controlled execution. Rather, the workload or similar reference workload is run with the power/performance control system disabled or "open-loop" so that the workload is executed at the maximum performance level. The power consumption is then measured at regular intervals and a performance figure is determined from computations that estimate the effect of closed-loop operation of the power/performance controls. Thus, a system administrator or integrator can determine what the performance of the processing system will be for a specified power budget, enabling a more informed decision about what an actual power budget for the system will be. Further, effects on processing performance of certain events can be predicted, such as the loss of available power or cooling that can be delivered to the processing system, due to power system or cooling system failures.

Figure 1:
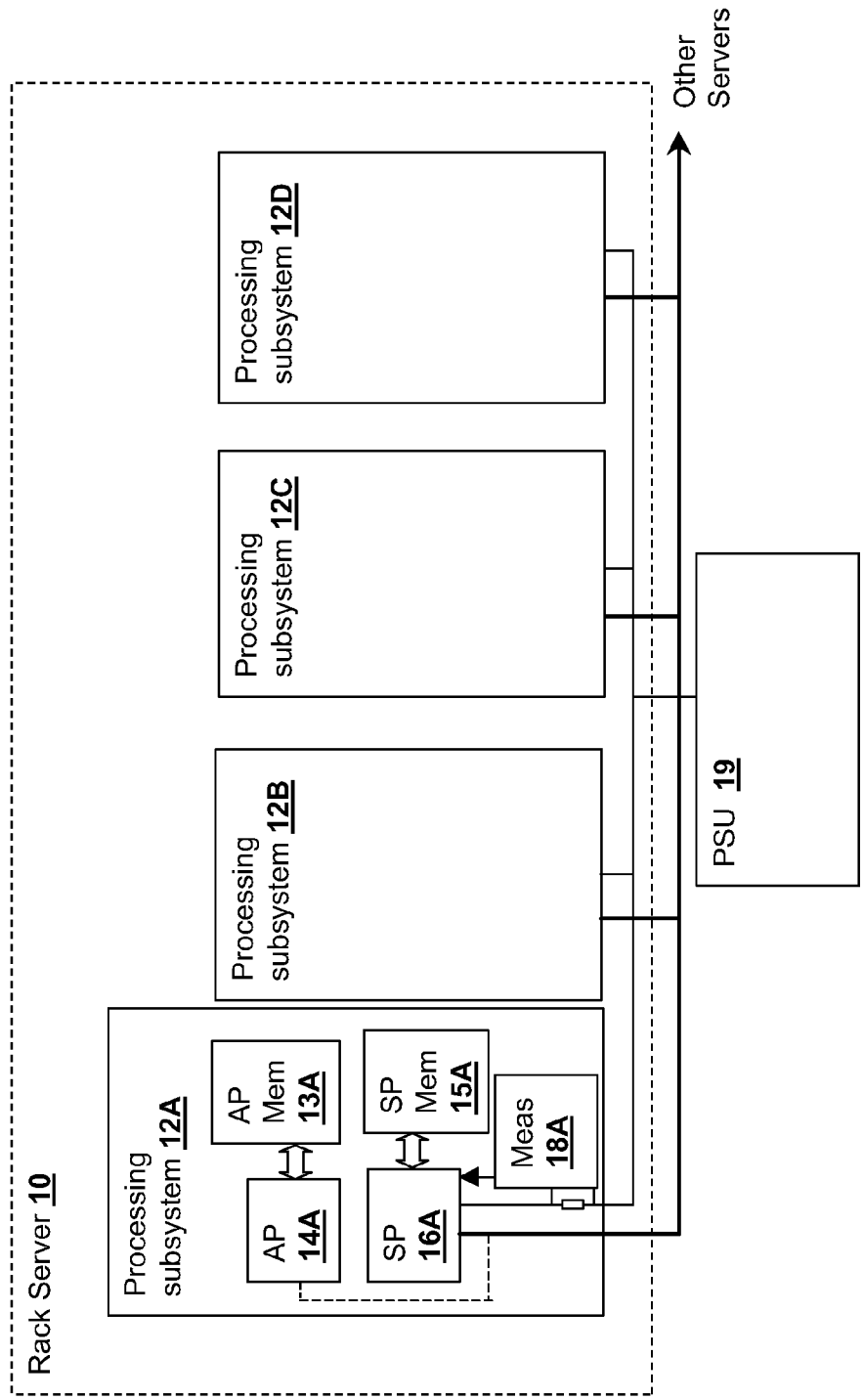
FIG. 1 is a block diagram of a multiple processing unit computing system in accordance with an embodiment of the invention.

Referring now to FIG. 1, a processing system is depicted in accordance with an embodiment of the present invention. Processing subsystems 12A-12D illustrate identical sub-units of the overall system, rack server 10, and interconnection between processing subsystems 12A-12D is not provided in detail, nor are connections to peripheral devices. Such connections and devices generally exist in processing systems and are understood in the art. The techniques of the present invention can also be applied to large-scale systems encompassing multiple rack servers 10 or other groups of computing systems that may or may not be located in the same facility, as long as the power budget can be specified across all of the sub-systems.

Within processing subsystem 12A, an application processor (AP) 14A is coupled to an application memory (AP Mem) 13A, which generally represent the processor and storage per processing system or "blade" that run operating environments, virtual machines, server instances and/or other tasks associated with the primary functions of the computing system. Also within processing system 12A (and similarly for the other identical processing systems 12B-12D), a service processor (SP) 16A provides control and monitoring functions for the processing system 12A including in the present embodiment, the accumulation and provision of power consumption and/or power measurement histogram data, as described in the above-incorporated U.S. Patent Application. Service processor 16A is coupled to a service processor memory (SP Mem) 15A that stores service processor program instructions and data that provides the power measurement data used as input to the techniques of the present invention.

The performance estimating application that polls service processor 16A and service processors within other sub-systems may be executed within an external computer system, or an application executing within an environment (virtual machine or operating system instance) within one or more of processing systems 12A-12D. The performance estimating application may also include of other monitoring applications for producing a display of system power consumption and/or power mode history, and may also include power control applications, as described in the above-incorporated U.S. Patent Application.

A power supply unit (PSU) 19 provides power to processing subsystems 12A-12D and may comprise more than one power supply unit operating in tandem (e.g., separate PSUs for each of other identical processing systems 12B-12D) or may supply power to separate partitions of the system. A power measuring unit 18A is shown within processing subsystem 12A, and is also present in other subsystems 12B-12D. Power measurement may be incorporated within PSU 19, and may also incorporate the techniques disclosed in the above-incorporated U.S. Patent Application in order to reduce data storage requirements and to provided power usage data at arbitrary intervals to multiple simultaneous monitoring applications. In general, the present invention may be applied to any system where closed-loop power/performance control is implemented in order to maintain a power budget. Power is measurable and quantified herein in units of Watts and performance is measurable in terms of the amount of time required to complete a task or another suitable figure of merit.

The closed-loop power/performance control may be continuous or be provided by a number of discrete levels. For example, the XEON processor (a product of Intel Corporation) includes 8 different clock-throttling power control modes corresponding to effective clock frequencies that range from 12.5% to 100% of the maximum frequency in steps of 12.5%. By monitoring the actual power usage for a given workload in each power/performance mode of each processor while the closed-loop power/performance control is disabled, an estimate of the relationship between power and performance is obtained and used to inform the estimate of performance for the workload under closed-loop power/performance control.

While the figure provides a concrete example of an architecture that implements the above-described performance estimating technique, the depicted architecture should not be construed as limiting. For example, the performance of a uniprocessor system may also be estimated, just as each subsystem (e.g., processor, memory and I/O subsystems) can be independently monitored and a performance estimate generated for each subsystem in the above-described embodiment. An overall performance estimate may then be aggregated from the various processors/subsystems in the actual configuration.

Figure 2:
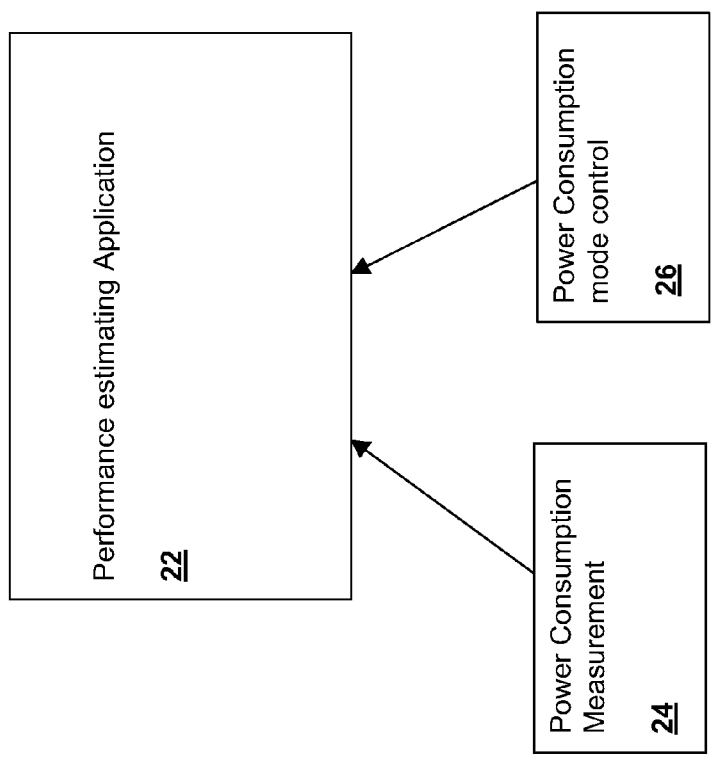
FIG. 2 is a software organization diagram of a computing system in accordance with an embodiment of the invention.

Referring now to FIG. 2, an organization of programs implementing the method of the present invention within the system of FIG. 1 is illustrated. A performance estimating application 22 as described above retrieves data from a power consumption measurement program 24 and controls a power consumption mode control 26 program. The power consumption measurement program 24 either provides a histogram data set representing data consumed in response to each poll or a sequence of samples of power consumption levels. Performance estimating application 22 also selects what performance level is set at processors in processing subsystems 12A-12D, and enables/disables the closed loop power control via power consumption mode control 26. While power measurement/management application 22 is representative of a single instance for the system of FIG. 1, multiple applications may be determining performance estimates for subsystems and the overall performance aggregated by either another application, or by on of the multiple power measurement/management applications 22. Power consumption measurement program 24 and/or power consumption mode control 26 programs are representative of multiple instances, generally one for each subsystem (and may be executed by a service processor, e.g. service processor 16A).

Figure 3B:
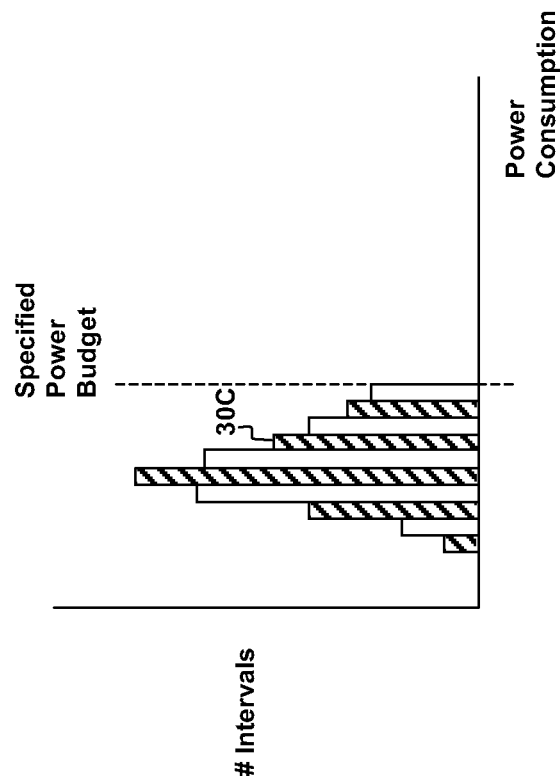
FIGS. 3A and 3B are pictorial diagrams depicting a histogram method in accordance with an embodiment of the invention.
Figure 3A:
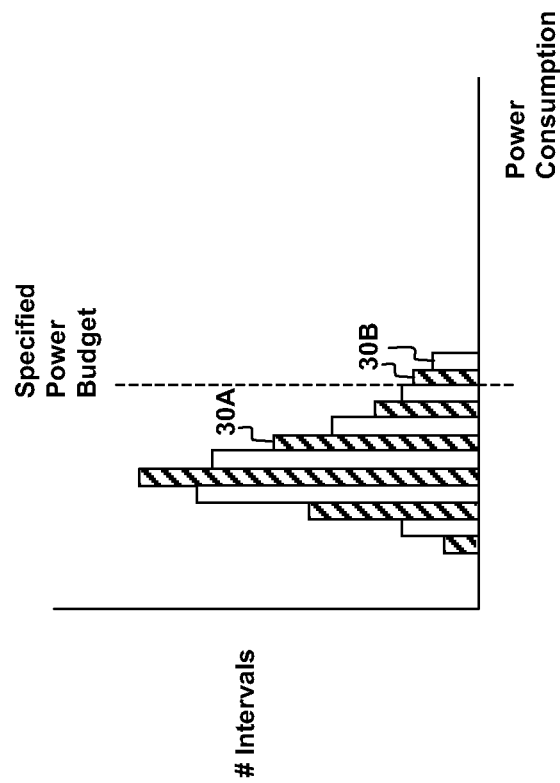

Referring now to FIGS. 3A-B, a histogram embodiment of the present invention is illustrated. In the histogram of FIG. 3A, a distribution of samples of actual power consumption is depicted, where no power control is enabled (power/performance control running open-loop at maximum performance). The histogram represents counts of samples of power consumption accumulated into discrete bins, according to ranges of power consumption values. Some bins 30A have ranges that fall below the specified power budget level, but other bins 30B may lie above the specified power budget level. If no counts are present in bins 30B having ranges above the specified power budget level, then the performance figure of merit for the given workload is 100%, unity, maximum frequency value or some other suitable indication to the user that no performance is lost at the given budget.

However, if there are counts in bins 30B above the specified power budget level, then the performance figure will be reduced below the maximum performance level by the estimating techniques of the present invention, just as in actuality the performance of the processing system will be reduced below the maximum possible performance level by the actions of the closed-loop power/performance control. FIG. 3B represents an estimate of a power value histogram under closed-loop control. Bins 30C have counts that are increased to absorb the processing of the workload that was accomplished at intervals of open-loop operation corresponding to bins 30B of FIG. 3A. By determining the relationship of processing system performance to the change necessary to transform the histogram of FIG. 3A to the histogram of FIG. 3B, it is possible to estimate the performance for a specified power budget. The present invention concerns method for performing the above-mentioned estimation.

Before describing a particular technique that can be used to perform the above-described estimation, another technique in accordance with the present invention will be described with reference to FIGS. 4A and 4B, in which the action of the estimating is more readily visible. The technique illustrated in FIGS. 4A and 4B is an alternative to the histogram technique described briefly above, but represents an estimation that can provide identical results and is, in essence, a different approach to the estimation process.

Figure 4A:
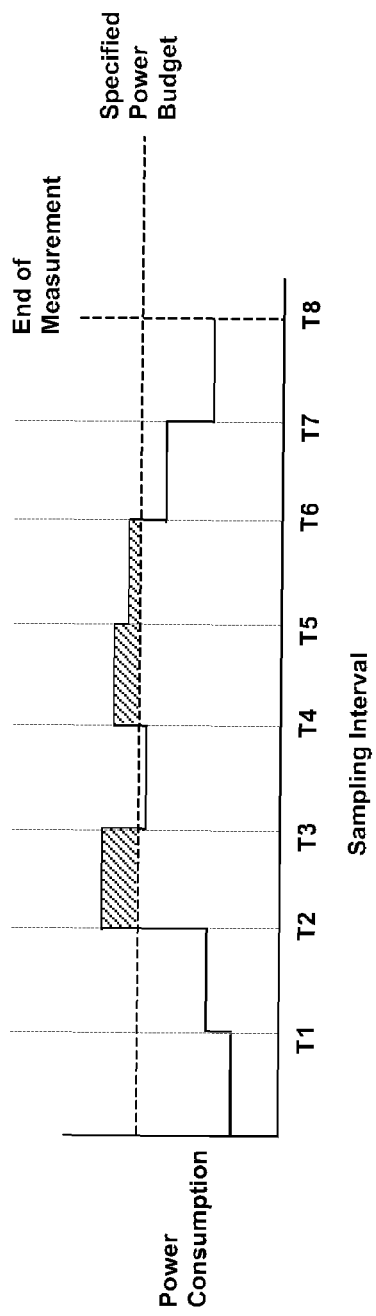
FIGS. 4A and 4B are pictorial diagrams depicting a timeline method in accordance with an embodiment of the invention.
Figure 4B:
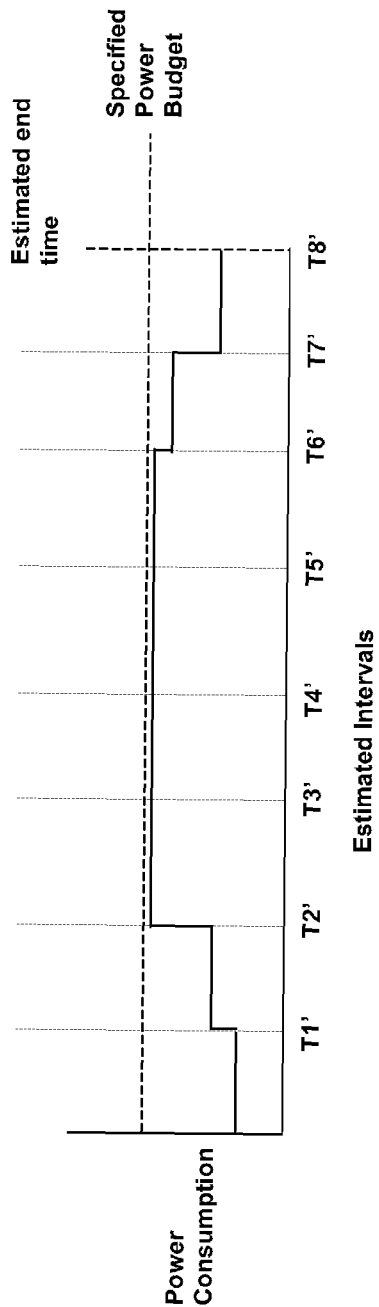

FIG. 4A depicts a timeline of power consumption values over regular intervals between times T1-T8. The specified power budget, illustrated by a dashed line, delineates intervals that are within the specified power budget, and those intervals (shaded) that exceed the power budget. FIG. 4A thus depicts an execution power consumption timeline for a workload when the power/performance control system is run unconstrained (maximum performance). FIG. 4B illustrates an estimated timeline that simulates the closed-loop action of the power/performance control. All sample intervals are below the specified power budget. However, the length of some of the intervals has been altered according to estimated intervals. The execution points corresponding to times T1-T8 in FIG. 4A are labeled T1'-T8' in FIG. 4B. The estimated intervals from T2'-T3', T4'-T5' and T5'-T6' are extended by an amount that represents how much additional time that portion of the workload would take to execute at the new lowered power/performance level that meets the specified power budget. The total performance difference between maximum performance and actual performance under the specified power budget is directly related to the time difference between T8 and T8' and can be used to compute a percentage of maximum performance or operating frequency.

In either of the techniques illustrated above, the estimation requires computation of a relationship between power and performance that is essentially non-linear, although piece-wise linear estimation may be used, as in the example provided below. In the histogram technique, the individual sampled power values are merged into the bin counts and therefore the accuracy of the technique is affected by the width of the bins, but as the width of the bins approaches the accuracy of the power measurement and estimating function employed in the timeline technique, the same performance estimate result will be produced.

The calculations used to arrive at a performance estimate in the histogram example can be expressed as a series of vector measurements and computations, where the elements of the vector correspond to the discrete power/performance levels available in the processing system.

First, a vector B representing open-loop maximum performance operation is collected via a histogram, such as that depicted in FIG. 3A, while running the workload. The counts in each bin represent the number of intervals that the workload spent in each discrete range of power levels. The fraction of time that the workload executed in each power range can be computed from vector B. For example, let B={265, 646, 392, 135, 100, 111, 1}. The fraction of time the workload executed in each power range is the vector normalized by the total (1650) of the counts in B, which can be expressed as

F={0.156, 0.392, 0.238, 0.0818, 0.0606, 0.0672, 0.0006}.

The P vector will represent the performance for each of the bins when the power budget is used. First, the M vector is constructed from the measured power for each of the power/performance states, e.g., M={122.2, 118.0, 112.5, 107.4, 103.1, 98.7, 94.5, 89.7} Watts, where M[0] is at full performance of the system and M[7] is at maximum throttling (e.g., lowest clock frequency that is set by the performance control algorithm). The power is measured with respect to the given workload at each of the power/performance levels available, e.g. at each programmable clock frequency ratio for the XEON processor example given above. (Note that the first element of M can be populated from the full-performance power measurement when the B vector was collected.)

Next, a D vector representing the change between the maximum performance value for M (i.e., M[0]) and each element of M is computed to represent the amount of power savings for modifying the power/performance state from maximum to the power/performance of the corresponding element. Therefore, D={0, 4.2, 9.7, 14.8, 19.1, 23.5, 27.7, 32.5} Watts. For the user-specified budget (or each tabulated budget level), an R vector is computed to normalize the D vector to the specified budget by adding the budget to the D vector, effectively rendering R[i]=budget +maximum workload power level−M[i], where i represents the power/performance level. Thus, for an exemplary power budget of 125W, R={125, 129.2, 134.7, 139.8, 144.1, 148.5, 152.7, 157.5} Watts. R expresses a relationship between the power/performance level and the required change to meet the power budget for a given open-loop power measurement. E.g., if the open-loop processing system runs the workload at 125W, then the maximum power/performance mode can be used, if the workload runs between 125W and 129.2W, then the next-lower power/performance mode must be used to meet the budget and so on.

In the histogram technique, we next compute an H vector, which is the mean power of each histogram bin range of the histogram used to produce the B vector. For example let H={119, 121, 123, 125, 127, 129, 131} Watts. Another vector S is used to represent the available power/performance states in fractions of the nominal processor frequency, e.g. for the XEON processor S={1, 0.875, 0.75, 0.625, 0.5, 0.375, 0.25, 0.125}. Next, a P vector is computed by interpolating in the histogram bins according to:

P[i]=1, if H[i]<specified power budget; or $P[i]=S[j]+(H[i]-R[j])*(S[j+1]-S[j])/(R[j+1]-R[j])$, where j is the power/performance level such that R[j]<H[i]<R[j+1], i.e., the upper power/performance level that brackets the histogram value specified by i in the R vector, or that performance level that will guarantee that group of counts in the $i^{th}$ bin will fall within the specified power budget. For the above example values, P={1, 1, 1, 1, 0.940, 0.880, 0.833} and represents how relatively slow each program interval (or bin intervals) would have to run to meet the power budget.

A similar computation can also give the amount of adjustment employed in the timeline technique of FIGS. 4A-4B on each interval, replacing H[i] in the above equation with the power value for each interval. Once processing mode j is discovered, then the time-interval change for the affected intervals can be computed from the adjusted frequency, i.e. from the P vector's relative specification of frequency and the overall increase in workload processing time computed.

For the histogram technique, the overall performance is similarly computed from the histogram counts. A T vector is computed to represent the fraction of time the processing system (or processor) spent in each of the power/performance modes during execution of the workload. First let U[i] represent B[i]/P[i], then $T[i]=U[i]/(U[0]+U[1]+ \ldots +U[N])$.

For the above example values, U[i]={265, 646, 392, 135, 106.386, 126.144, 1.200} Watts and T[i]={0.159, 0.386, 0.234, 0.081, 0.064, 0.075, 0.001}.

The overall performance figure is computed as the dot product of the P vector with the T vector, which in the example would be 0.159*1+0.386*1+0.234*1+0.081*1+0.064*0.940+0.075*0.880+0.001*0.833=0.987 or 98.7% of the nominal clock frequency.

Figure 5:
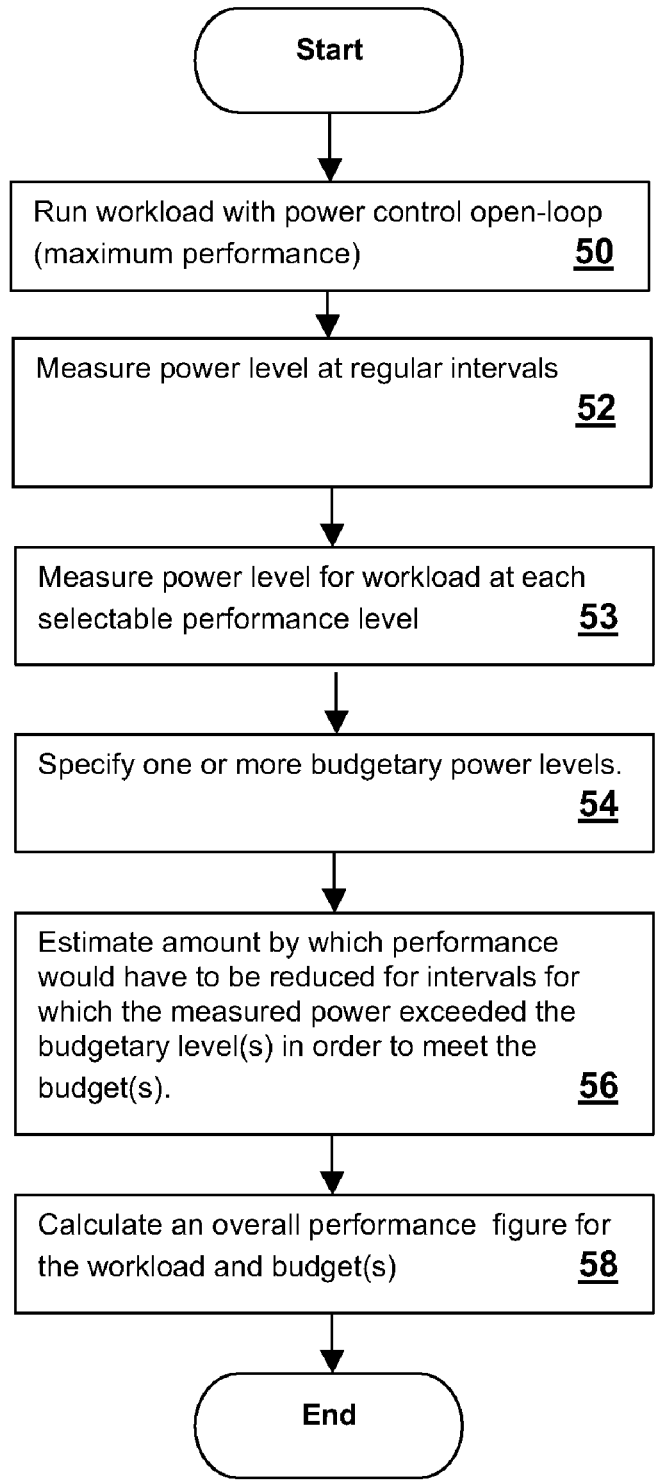
FIG. 5 is a flowchart depicting a method in accordance with an embodiment of the present invention.

Referring now to FIG. 5, a performance estimating method in accordance with an embodiment of the invention is depicted in a flowchart. First a workload is run with the power/performance control set to maximum performance (step 50). The service processor then measures actual power consumption of the combined processing subsystems at regular intervals (step 52) to gather the open-loop power consumption data. Also, the power consumption of the workload is measured at each performance level for open-loop operation (step 53). The user or tabulated list specifies one or more budgetary power levels (step 54) and the performance estimating application 56 determines the amount by which performance would have to be reduced in order for all intervals performance figure of merit is generated for the specified power budget for the workload (step 58).

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A computer-performed method of estimating performance of an electronic system having a closed-loop power/performance control for at least one predetermined budgetary power level, said method comprising:
   collecting samples of actual power consumption over a plurality of measurement intervals while said closed-loop power/performance control is disabled;
   determining altered power/performance levels for said samples that exceeded said predetermined budgetary power level such that said predetermined budgetary power level would be met;
   calculating a measure of relative durations of said samples that exceeded said predetermined budgetary power level with respect to a total of said measurement intervals; and
   computing a performance figure of merit in conformity with a product of said relative durations and said altered power/performance levels; and
   performing at least one of displaying results of said computing or performing power control within said electronic system in conformity with a result of said computing.

2. The method of claim 1, wherein said collecting comprises accumulating counts of values of said actual power consumption in corresponding ones of a plurality of storage locations corresponding to bins of a histogram, wherein said determining determines said altered power/performance levels for each bin that has a corresponding power range exceeding said predetermined budgetary power level, and wherein said calculating calculates a ratio of a count for each bin to a total number of counts over all bins.

3. The method of claim 1, wherein said collecting comprises collecting individual samples of said actual power consumption, and wherein said calculating calculates an estimated duration of each of said samples exceeding said predetermined budgetary power level in conformity with corresponding ones of said altered power/performance levels.

4. The method of claim 1, further comprising:
   measuring reference power consumption level of said electronic system for each one of said power/performance levels while said power/performance control is disabled; and
   normalizing said reference power consumption levels to said predetermined budgetary power level, and wherein said determining is performed by interpolating between said normalized reference power levels.

5. The method of claim 1, wherein said electronic system is a processing system, and wherein said collecting collects samples of actual power consumption of said processing system while said processing system is executing a particular workload.

6. The method of claim 5, further comprising receiving a user input specifying said particular workload.

7. A system, comprising at least one processor coupled to at least one memory for storing program instructions for execution by said processor for estimating performance of an electronic system having a closed-loop power/performance control for at least one predetermined budgetary power level, wherein said program instructions comprise program instructions for:
   collecting samples of actual power consumption over a plurality of measurement intervals while said closed-loop power/performance control is disabled;
   determining altered power/performance levels for said samples that exceeded said predetermined budgetary power level such that said predetermined budgetary power level would be met;
   calculating a measure of relative durations of said samples that exceeded said predetermined budgetary power level with respect to a total of said measurement intervals; and
   computing a performance figure of merit in conformity with a product of said relative durations and said altered power/performance levels; and
   performing at least one of displaying results of said computing or performing power control within said electronic system in conformity with a result of said computing.

8. The system of claim 7, wherein said at least one processor comprises a service processor coupled to a service processor memory and an application processor coupled to an application memory, wherein said program instructions for collecting and disabling are stored in said service processor memory and executed by said service processor, wherein said program instructions for determining, calculating and computing are stored in said application memory and executed by said application processor, and wherein said program instructions stored in said application memory further comprise program instructions for polling said service processor to supply said collected samples.

9. The system of claim 7, wherein said program instructions for collecting comprise instructions for accumulating counts of values of said actual power consumption in corresponding ones of a plurality of storage locations corresponding to bins of a histogram, wherein said program instructions for determining determine said altered power/performance levels for each bin that has a corresponding power range exceeding said predetermined budgetary power level, and wherein said program instructions for calculating calculate a ratio of a count for each bin to a total number of counts over all bins.

10. The system of claim 7, wherein said program instructions for collecting comprise program instructions for collecting individual samples of said actual power consumption, and wherein said program instructions for calculating calculate an estimated duration of each of said samples exceeding said predetermined budgetary power level in conformity with corresponding ones of said altered power/performance levels.

11. The system of claim 7, further comprising program instructions for:
   measuring reference power consumption level of said electronic system for each one of said power/performance levels while said power/performance control is disabled; and
   normalizing said reference power consumption levels to said predetermined budgetary power level, and wherein said determining is performed by interpolating between said normalized reference power levels.

12. The system of claim 7, wherein said electronic system is a processing system, and wherein said program instructions for collecting collect samples of actual power consumption of said processing system while said processing system is executing a particular workload.

13. The system of claim 12, wherein said processing system is
said system comprising said at least one processor.

14. The system of claim 12, further comprising program instructions for receiving a user input specifying said particular workload.

15. A computer program product comprising computer-readable storage media encoding program instructions for execution by a processor for estimating performance of an electronic system having a closed-loop power/performance control for at least one predetermined budgetary power level, said program instructions comprising program instructions for:

collecting samples of actual power consumption over a plurality of measurement intervals while said closed-loop power/performance control is disabled;

determining altered power/performance levels for said samples that exceeded said predetermined budgetary power level such that said predetermined budgetary power level would be met;

calculating a measure of relative durations of said samples that exceeded said predetermined budgetary power level with respect to a total of said measurement intervals; and computing a performance figure of merit in conformity with a product of said relative durations and said altered power/performance levels; and performing at least one of displaying results of said computing or performing power control within said electronic system in conformity with a result of said computing.

16. The computer program product of claim 15, wherein said program instructions for collecting comprise instructions for receiving accumulated counts of values of said actual power consumption in corresponding ones of a plurality of storage locations corresponding to bins of a histogram, wherein said program instructions for determining determine said altered power/performance levels for each bin that has a corresponding power range exceeding said predetermined budgetary power level, and wherein said program instructions for calculating calculate a ratio of a count for each bin to a total number of counts over all bins.

17. The computer program product of claim 15, wherein said program instructions for collecting comprise program instructions for receiving collections of individual samples of said actual power consumption, and wherein said program instructions for calculating calculate an estimated duration of each of said samples exceeding said predetermined budgetary power level in conformity with corresponding ones of said altered power/performance levels.

18. The computer program product of claim 15, further comprising program instructions for:

measuring reference power consumption level of said electronic system for each one of said power/performance levels while said power/performance control is disabled; and normalizing said reference power consumption levels to said predetermined budgetary power level, and wherein said determining is performed by interpolating between said normalized reference power levels.

19. The computer program product of claim 15, wherein said electronic system is a processing system, and wherein said program instructions for collecting collect samples of actual power consumption of said processing system while said processing system is executing a particular workload.

20. The computer program product of claim 19, further comprising program instructions for receiving a user input specifying said particular workload.

* * * * *